United States Patent
Huang (10) Patent No.: US 9,945,532 B2
(45) Date of Patent: Apr. 17, 2018

(54) LIGHT-EMITTING DIODE LIGHT SOURCE AND LAMP

(71) Applicant: Liquidleds Lighting Corp., Taipei (TW)

(72) Inventor: David Huang, Taipei (TW)

(73) Assignee: Liquidleds Lighting Corp., Taipei (TW)

(*) Notice: Subject to any disclaimer, the term of this patent is extended or adjusted under 35 U.S.C. 154(b) by 145 days.

(21) Appl. No.: 15/165,246

(22) Filed: May 26, 2016

(65) Prior Publication Data
US 2017/0248277 A1 Aug. 31, 2017

(30) Foreign Application Priority Data
Feb. 26, 2016 (TW) .................................. 105106012

(51) Int. Cl.
| | |
|---|---|
| F21V 15/00 | (2015.01) |
| F21V 3/00 | (2015.01) |
| H01L 33/62 | (2010.01) |
| F21S 4/26 | (2016.01) |
| F21K 99/00 | (2016.01) |
| F21V 23/06 | (2006.01) |
| H01L 33/20 | (2010.01) |
| H01L 33/56 | (2010.01) |

(Continued)

(52) U.S. Cl.
CPC ................ *F21V 3/00* (2013.01); *F21K 9/135* (2013.01); *F21S 4/26* (2016.01); *F21V 23/06* (2013.01); *H01L 33/20* (2013.01); *H01L 33/56* (2013.01); *H01L 33/62* (2013.01); *F21K 9/232* (2016.08); *F21Y 2101/02* (2013.01); *F21Y 2115/10* (2016.08); *H01L 33/647* (2013.01)

(58) Field of Classification Search
CPC ... F21K 9/23–9/238; F21S 4/26; F21V 23/06; F21V 3/00; F21Y 2115/10; H01L 33/20; H01L 33/56; H01L 33/62; H01L 33/647
See application file for complete search history.

(56) References Cited

U.S. PATENT DOCUMENTS

| | | | |
|---|---|---|---|
| 6,857,767 B2 * | 2/2005 | Matsui .................. | F21V 29/004 257/E25.02 |
| 9,478,587 B1 * | 10/2016 | Liu ....................... | H01L 27/3218 |

(Continued)

FOREIGN PATENT DOCUMENTS

| | | |
|---|---|---|
| CN | 2413390 Y | 1/2001 |
| CN | 2611741 Y | 4/2004 |

(Continued)

*Primary Examiner* — Ali Alavi
(74) *Attorney, Agent, or Firm* — C. G. Mersereau; Nikolai & Mersereau, P.A.

(57) ABSTRACT

A light-emitting diode (LED) light source includes a plurality of electricity-conducting holding elements, and each electricity-conducting holding element is made of a thin metal sheet. The bendable LED light source increases installation of sufficient number of LED dies by lengthening the length of the LED light source. The LED light source is bent to form a spring-like helical structure and then is placed inside a lamp cover. The helical LED light source is fastened on a T-shaped element by a plurality of fastening elements and the T-shaped element is fixed on an insulated holder. Accordingly, a bulb-type LED lamp is implemented.

20 Claims, 6 Drawing Sheets

(51) Int. Cl.
  *H01L 33/64*    (2010.01)
  *F21K 9/232*    (2016.01)
  *F21Y 115/10*   (2016.01)
  *F21Y 101/02*   (2006.01)

(56)     References Cited

U.S. PATENT DOCUMENTS

| | | | |
|---|---|---|---|
| 2003/0052594 A1* | 3/2003 | Matsui | H01L 25/0753 |
| | | | 313/495 |
| 2003/0071581 A1* | 4/2003 | Panagotacos | F21V 5/04 |
| | | | 315/185 R |
| 2003/0193803 A1* | 10/2003 | Lin | F21S 4/24 |
| | | | 362/249.04 |
| 2010/0164409 A1 | 7/2010 | Lo et al. | |
| 2015/0092413 A1 | 4/2015 | Li et al. | |

FOREIGN PATENT DOCUMENTS

| | | |
|---|---|---|
| CN | 2718387 Y | 8/2005 |
| CN | 203517451 U | 4/2014 |
| CN | 104157772 A | 11/2014 |
| EP | 1357331 A1 | 10/2003 |
| JP | 2002057371 | 2/2002 |
| JP | 2015179648 | 10/2015 |
| WO | 2015081804 | 6/2015 |

\* cited by examiner

LIGHT-EMITTING DIODE LIGHT SOURCE AND LAMP

CROSS-REFERENCE TO RELATED APPLICATIONS

This application claims the benefit of Taiwan patent application No. 105106012, filed on Feb. 26, 2016, the disclosure of which is incorporated herein in its entirety by reference.

BACKGROUND

1. Technical Field

The present disclosure relates generally to a lamp with a light source, and more particularly to a light-emitting diode (LED) light source and an LED lamp.

2. Description of Related Art

Figure 4A:
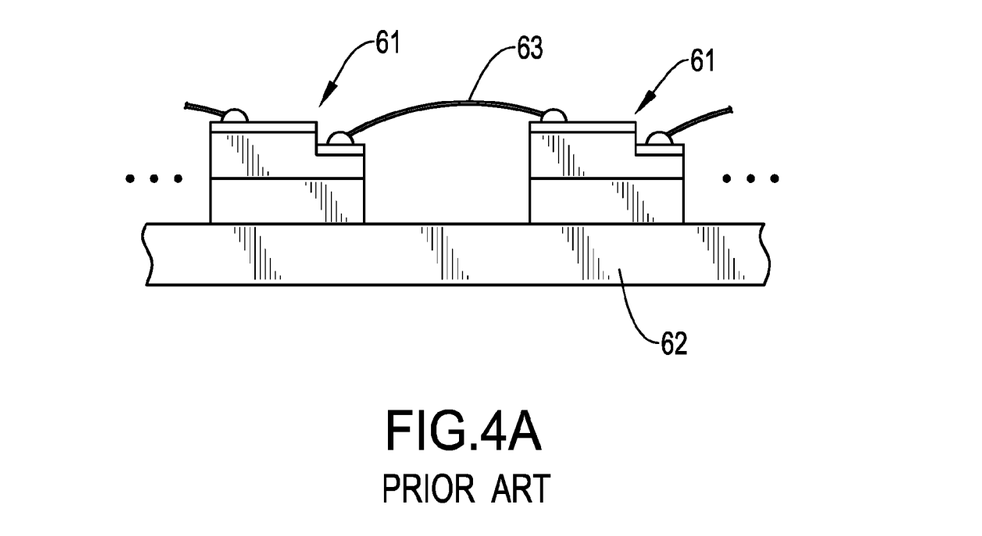
FIG. 4A is a schematic plan view of a conventional light source composed of double-sided light emission LEDs.
Figure 4B:
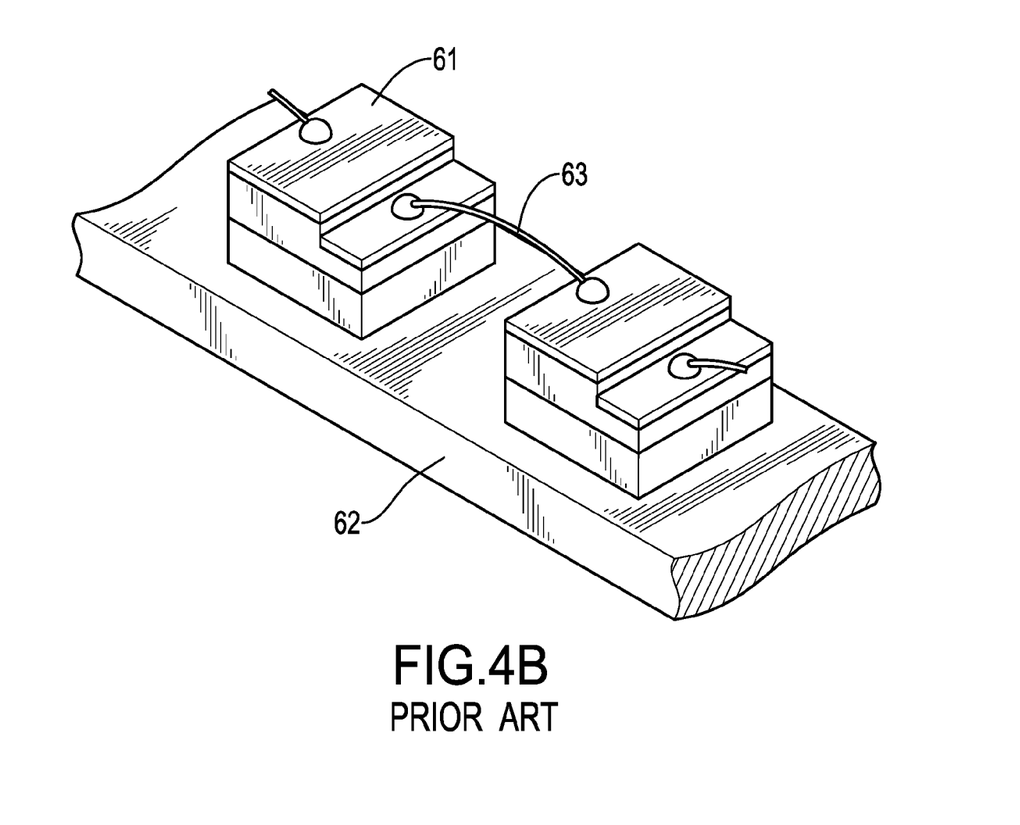
FIG. 4B is a schematic perspective view of the conventional light source composed of double-sided light emission LEDs.

FIG. 4A and FIG. 4B show a schematic plan view and a schematic perspective view of a conventional light source composed of double-sided light emission LEDs, respectively. The conventional LED light source includes a plurality of LED dies 61 and a substrate 62, and the LED dies 61 are installed on the substrate 62. In particular, the substrate 62 is a hard transparent substrate, such as a glass substrate, pattern sapphire substrate (PSS), or ceramic substrate.

Two adjacent LED dies 61 are electrically connected via a connecting wire 63 with two ends. More specifically, each LED die 61 has two connection terminals with opposite polarities including a positive connection terminal and a negative connection terminal. One end of the connecting wire 63 is electrically connected to the positive connection terminal of one of the two adjacent LED dies 61. The other end of the connection wire 63 is electrically connected to the negative connection terminal of the other of the two adjacent LED dies 61. Accordingly, the LED dies 61 on the substrate 62 are connected in series via the connecting wires 63 to form a straight upright LED light source.

However, the length of the conventional LED light source is limited and cannot be too long because the substrate 62 is composed of frangible materials. In addition, the connecting wires 63 are easily separated from the connection terminals of the LED dies 61. Hence, possibility of the disconnection between the connecting wires 63 and the LED dies 61 may increase since the connecting wires 63 are merely connected to the connection terminals of the LED dies 61.

Figure 5:
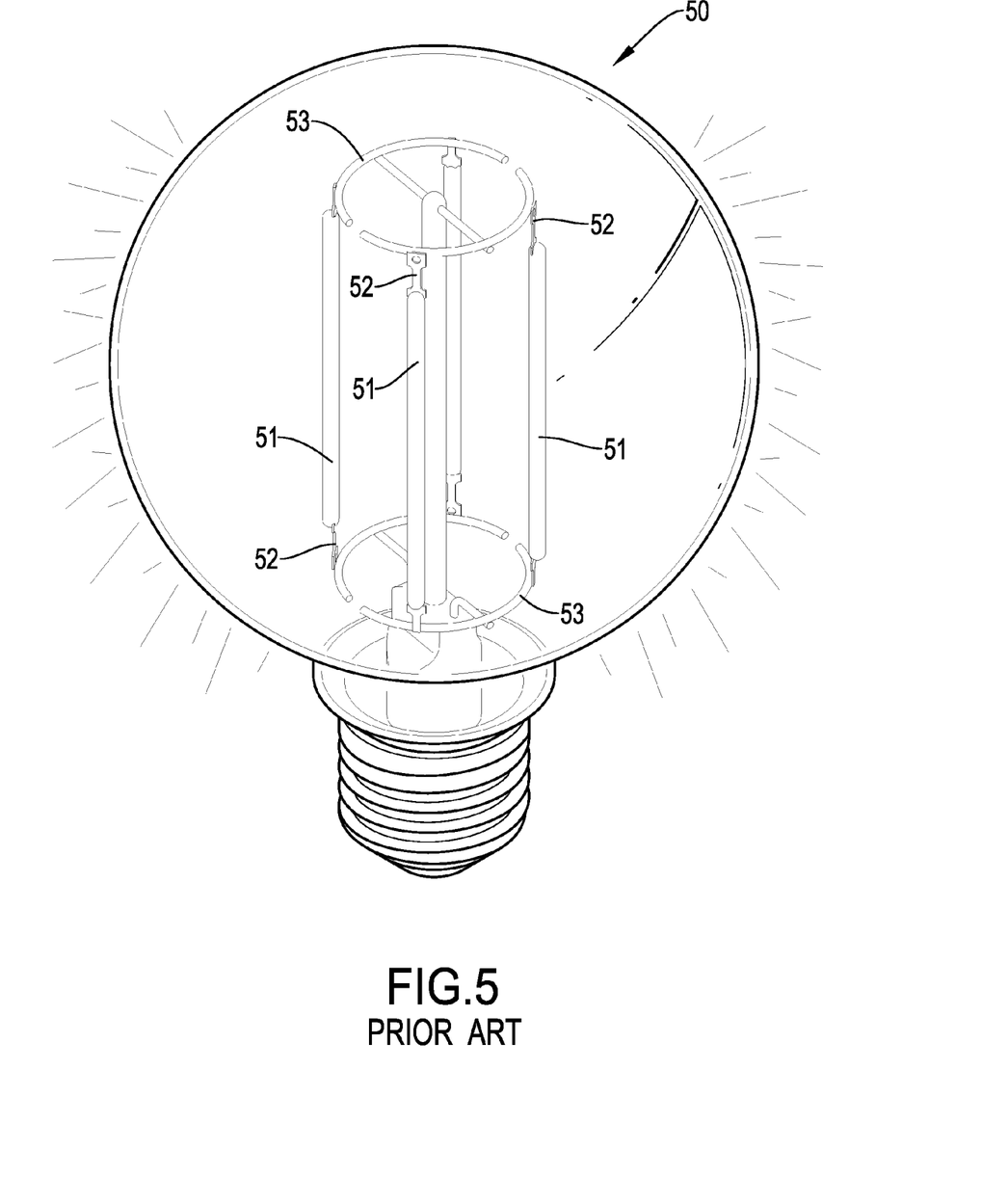
FIG. 5 is a schematic perspective view of a conventional LED lamp.

A dead zone generated from the upright LED light source exists at two ends of the LED light bar since the light-emitting direction of the upright LED light bar is limited in a radial direction. Hence, plural upright LED light bars arranged around are used as shown in FIG. 5 to provide higher brightness. However, the dead zone still exists at a top area and a bottom area of the LED light bars, i.e., a global lighting effect cannot be created.

Further, the increased possibilities of the failed welding processing of the LED light bars 51, the fixed frames 53 and the metal conductors 52 and increased working hours because of the use of more LED light bars 51 and metal conductors 52 would occur.

The length of the LED light bar 51 is limited and cannot be too long because of the substrate 62 composed of frangible materials. Hence, the applications of the LED light bars are limited to only specific size LED lamps because of the length of the LED light bar.

FIG. 5 shows a schematic perspective view of a conventional LED lamp. The LED lamp 50 is a ball bulb with a plurality of LED light bars 51, and each LED light bar 51 is the straight light bar shown in FIG. 4A. Two ends of each LED light bar 51 are connected to the fixed frames 53 via metal conductors 52. In particular, each metal conductor 52 is connected to the corresponding LED light bar 51 and fixed frame 53 in a welding manner. Accordingly, the metal conductors 52 are used for electrical connections between the LED light bars 51 and the fixed frames 53 as well as structural support of the LED light bars 51.

SUMMARY

An objective of the present disclosure is to provide a light-emitting diode (LED) light source to solve problems of the existence of a "dead zone" generated from the upright LED light bar and the increased possibilities of the failed welding processing and increased working hours because of the use of more LED light bars.

In order to achieve the above-mentioned objective, the LED light source includes a plurality of LED dies and a plurality of electricity-conducting holding elements. The electricity-conducting holding elements are metal sheets respectively; wherein adjacent two of the electricity-conducting holding elements jointly hold and electrically connect to one of the LED dies to form a flexible LED light bar.

Accordingly, the bendable multi-turn helical LED light bar provides illumination in all directions and higher brightness by lengthening the length of the LED light source. Furthermore, the connection strength between each electricity-conducting holding element and each LED die is increased because of thin and broad structure of the electricity-conducting holding element. Also, the operation of bending the electricity-conducting holding elements into a helical structure is easy to make the LED light bar helix-shaped.

Another objective of the present disclosure is to provide a light-emitting diode (LED) lamp to solve problems of the existence of a "dead zone" generated from the upright LED light bar and the increased possibilities of the failed welding processing and increased working hours because of the use of more LED light bars.

In order to achieve the above-mentioned objective, the LED lamp includes an LED light source, a lamp base, an insulated holder, a supporting element, a plurality of fastening elements and a lamp cover. The LED light source includes a plurality of LED dies and a plurality of electricity-conducting holding elements. Each LED die is a flip-chip LED die or an OLED die. The electricity-conducting holding elements are metal sheets respectively, and adjacent two of the electricity-conducting holding elements jointly hold and electrically connect to one of the LED dies to form a flexible LED light bar.

The lamp base has a first connection part and a second connection part electrically connected to two electricity-conducting holding elements at two ends of the LED light bar, respectively. The insulated holder is fixed on the lamp base. The supporting element has a longitudinal part and a transverse part mounted on the longitudinal part; wherein the longitudinal part is mounted on the insulated holder, and the LED light source helically surrounds an outside of the transverse part. The fastening elements fasten the LED light source on the transverse part. The lamp cover covers the lamp base and provides a containing space for containing the LED light source, the insulated holder, the supporting element and the fastening elements.

Accordingly, the bendable multi-turn helical LED light bar provides illumination in all directions and higher brightness by lengthening the length of the LED light source.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The features of the present disclosure believed to be novel are set forth with particularity in the appended claims. The present disclosure itself, however, may be best understood by reference to the following detailed description of the present disclosure, which describes an exemplary embodiment of the present disclosure, taken in conjunction with the accompanying drawings, in which:

DETAILED DESCRIPTION

Reference will now he made to the drawing figures to describe the present disclosure in detail.

Figure 1A:
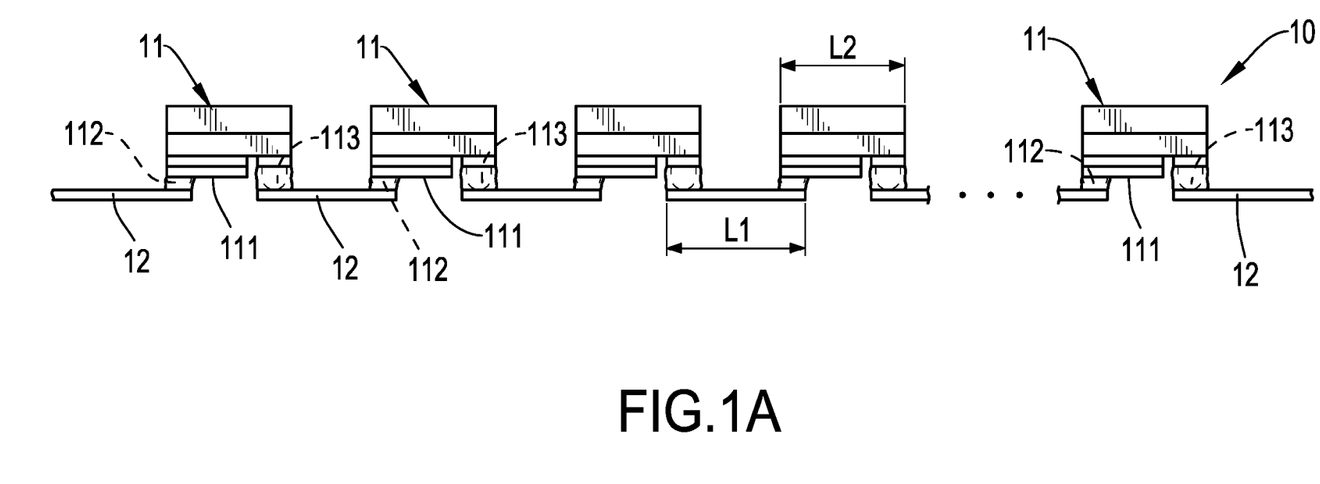
FIG. 1A is a schematic plan view of a light-emitting diode (LED) light source according to the present disclosure.
Figure 1B:
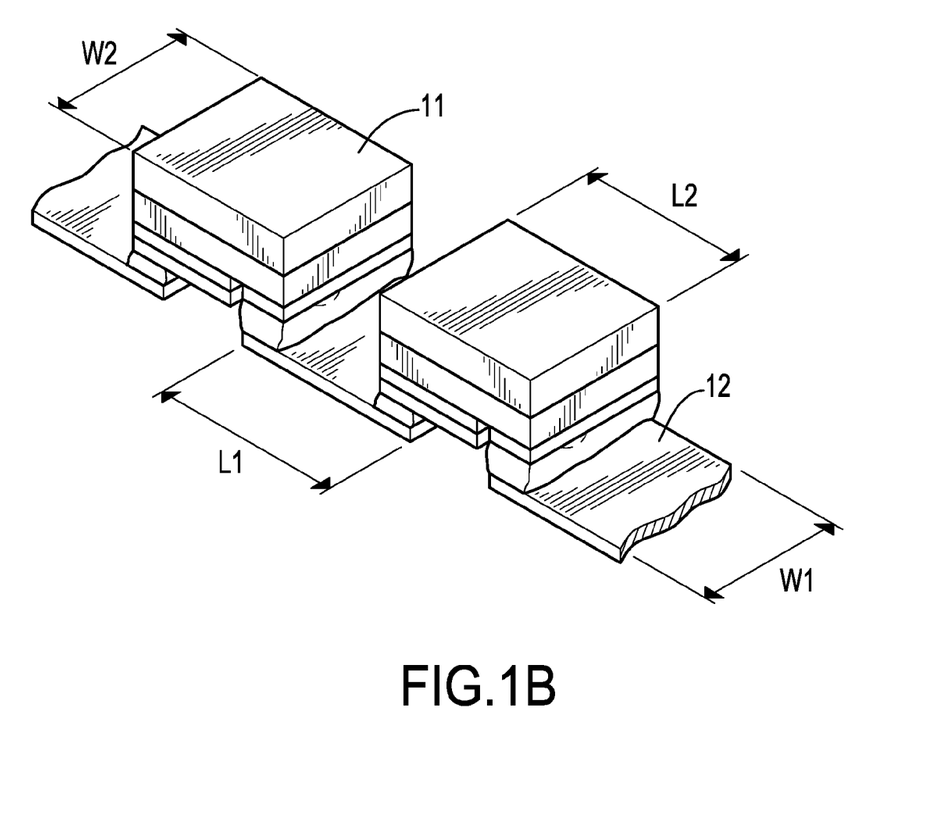
FIG. 1B is a schematic perspective view of the LED light source according to the present disclosure.

FIG. 1A and FIG. 1B show a schematic plan view and a schematic perspective view of an LED light source 10 according the present disclosure, respectively. The LED light source 10 includes a plurality of LED dies 11 and a plurality of electricity-conducting holding elements 12. Adjacent two of the electricity-conducting holding elements 12 jointly hold and electrically connect to one of the LED dies 11 to form a flexible LED light bar. More specifically, the electricity-conducting holding elements 12 and the LED dies 11 are alternately electrically connected in series. As shown in FIG. 1A, a connection relationship between the electricity-conducting holding elements 12 and the LED dies 11 from left to right is that the electricity-conducting holding element 12 and the LED die 11 are alternately connected in sequence. In the present disclosure, each electricity-conducting holding element 12 is, but not limited to, a metal sheet, such as a copper foil sheet, an aluminum foil sheet, a silver foil sheet, or a gold foil sheet. Further, a bendable and electrically conductive material can be used for the electricity-conducting holding element 12.

More specifically, each LED die 11 is a flip-chip LED die or an OLED (organic light-emitting diode) die, and each LED die 11 has a positive polarity 112 and a negative polarity 113 for an external electrical connection. In this embodiment, the positive polarity 112 and the negative polarity 113 are installed at two opposite sides of a bottom of the LED die 11, respectively. The electricity-conducting holding element 12 is electrically connected between two adjacent LED dies 11, i.e., one terminal of the electricity-conducting holding element 12 is electrically connected to the positive polarity 112 of one LED die 11 and the other terminal of the electricity-conducting holding element 12 is electrically connected to the negative polarity 113 of the other LED die 11. The discontinuous sheet structure of the electricity-conducting holding elements 12 are correspondingly connected in series to the polarities of the LED dies 11 to form the LED light source 10. In this embodiment, two ends of the LED light bar are respectively connected to one electricity-conducting holding element 12 so that the two electricity-conducting holding elements 12 are electrically connected to a positive polarity and a negative polarity of an external power source, such an AC power source, respectively.

Each LED die 11 is a double-sided light emission LED with a light-emitting surface 111 on a bottom surface of the LED die 11, and further another light-emitting surface on a top surface of the LED die 11 is provided. It is assumed that only the light-emitting surface 111 is provided so that each LED die 11 produces light and the light is emitted via the light-emitting surface 111. In particular, the light-emitting surface 111 is located and not covered between two electricity-conducting holding elements 12.

In addition, a length of each electricity-conducting holding element 12 is defined as a first length L1 and a length of each LED die 11 is correspondingly defined as a second length L2. In particular, the first length L1 is greater than or equal to the second length L2. Accordingly, the connection strength between each electricity-conducting holding element 12 and each LED die 11 is increased under installation of sufficient number of the LED dies 11 so as to increase the ease of bending the electricity-conducting holding elements 12 and avoid separation between the electricity-conducting holding elements 12 and the LED dies 11 when the electricity-conducting holding elements 12 are bent.

Further, a width of each electricity-conducting holding element 12 is defined as a first width W1 and a width of each LED die 11 is defined as a second width W2. In particular, the first width W1 is greater than or equal to one-half of the second width W2. Accordingly, the electricity-conducting holding element 12 can provide sufficient width for firmly connecting to the corresponding positive polarity 112 and negative polarity 113, thus preventing the electricity-conducting holding element 12 and the LED dies 11 being disconnected.

Furthermore, each electricity-conducting holding element 12 is a metal sheet to improve heat-dissipating capability of cooling the LED dies 11.

The LED light source 10 can be packaged in a transparent packaging body 30 (as shown hereinafter in FIG. 2) by packaging technology. More specifically, the LED light source 10 is filled and sealed in the transparent packaging body 30 by transparent resin material, transparent silicone material, or transparent polymer material so as to increase connection strength between the electricity-conducting holding elements 12 and the LED dies 11.

Figure 2:
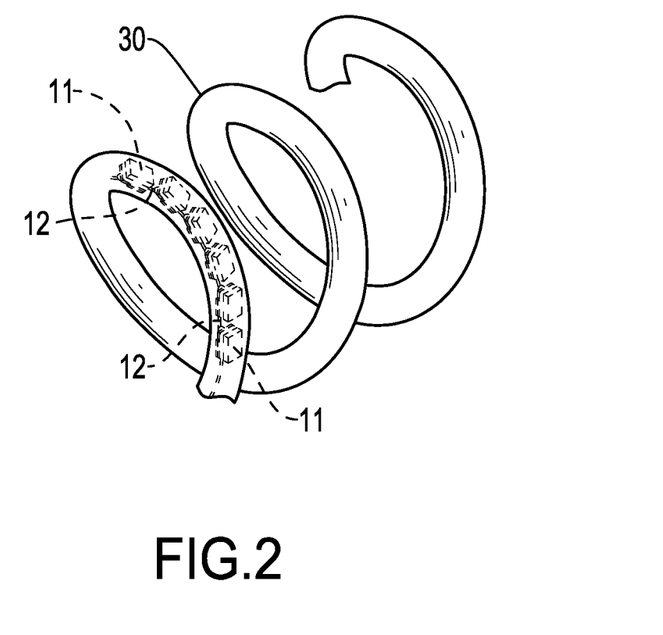
FIG. 2 is a schematic perspective view of bending the LED light source according to the present disclosure.

FIG. 2 shows a schematic perspective view of bending the LED light source according to the present disclosure. By bending the electricity-conducting holding elements 12, the LED light source 10 (as shown in FIG. 1A) forms a spring-like helical structure.

Figure 3:
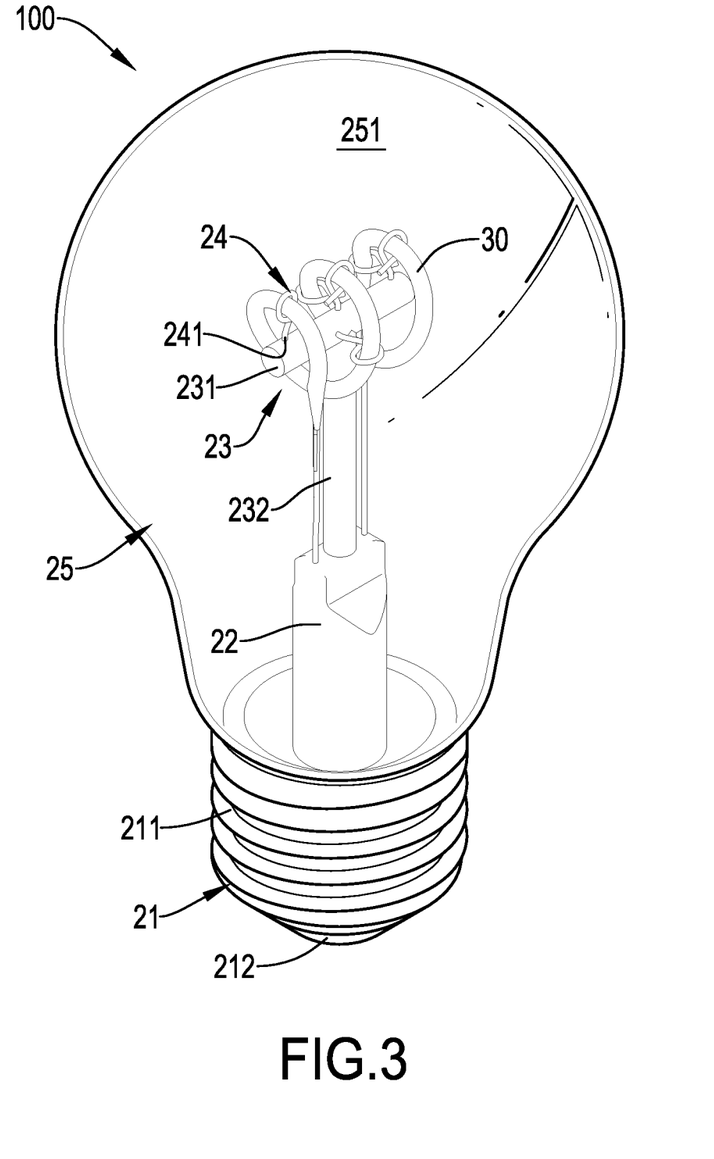
FIG. 3 is a schematic perspective view of an LED lamp with the LED light source according to the present disclosure.

FIG.3 shows a schematic perspective view of an LED lamp with the LED light source according to the present disclosure. The LED lamp 100 includes the above-mentioned LED light source 10, a lamp base 21, an insulated holder 22, a supporting element 23, a plurality of fastening elements 24, and a lamp cover 25.

The lamp base 21 provides two connection parts, i.e., a first connection part 211 is provided at a side of the lamp base 21 and a second connection part 212 is provided at a bottom of the lamp base 21. The first connection part 211 and the second connection part 212 are electrically connected to two opposite polarities of the external power source, respectively.

In this embodiment, the insulated holder 22 is made of a glass material and is fixed on the lamp base 21. The supporting element 23 has a transverse part 231 and a longitudinal part 232, and the supporting element 23 is made of a glass material. In this embodiment, the supporting element 23 is a T-shaped element, and the transverse part 231 is a horizontal part of the T-shaped element and the longitudinal part 232 is an upright part of the T-shaped element, i.e., the transverse part 231 is mounted on a top of the longitudinal part 232. In particular, the longitudinal part 232 is installed on the insulated holder 22. In this embodiment, the insulated holder 22 and the supporting element 23 are integrally formed. In one example, the glass insulated holder 22 is exemplified for demonstration as follows. The insulated holder 22 and the supporting element 23 are integrally formed by glass forming technology. Additionally, the insulated holder 22 and the supporting element 23 are separated into two elements, i.e., the insulated holder 22 and the supporting element 23 are not integrally formed. The longitudinal part 232 of the supporting element 23 is formed and fixed on the insulated holder 22. In addition, the transverse part 231 of the supporting element 23 is mounted through the helical LED light source 10 along an axial direction so that the LED light source 10 helically surrounds the outside of the transverse part 231.

Each fastening element 24 has an end part 241, and the end part 241 is fixed on the transverse part 231 of the supporting element 23. In particular, the fastening elements 24 are used to fasten the LED light source 10 on the transverse part 231 of the supporting element 23 by twining or hooking the fastening elements 24 on the LED light source 10. In the present disclosure, the embodiment shown in FIG. 3 is not limited to the details of the present disclosure. In addition, the LED light source 10 is not limited to be bent into the helical structure, i.e., the LED light source 10 can be bent into structures of other shapes in response to the actual application requirements. Accordingly, the bendable and shape-variable LED light source 10 has advantages of high brightness and structural diversification.

The lamp cover 25 is closely covered on the lamp base 21 to provide a containing space 251 for containing the LED light source 10, the insulated holder 22, the supporting element 23 and the fastening elements 24 to form the LED lamp 100.

In conclusion, the present disclosure has the following advantages:

1. The electricity-conducting holding elements 12 are provided to jointly hold and electrically connect the LED dies 11 instead of using the conventional substrate 62 and connecting wires 63 so as to increase connection strength of LED dies 11 as well as to hold the LED dies 11;

2. The LED light source 10 is bent into the multi-turn helical structure or into structures of other shapes so as to increase the brightness by assembling more LED dies 11 in a limited space of the LED lamp 100;

3. Unlike the upright LED light bar, the bendable multi-turn helical LED light bar provides illumination in all directions to avoid the "dead zone" and provides a uniform 360-degree illumination range without using plural upright LED light bars; and 4. The length and the width of the electricity-conducting holding element 12 are especially designed to improve heat-dissipating capability of cooling the LED dies 11 as well as increase connection strength between the electricity-conducting holding elements 12 and the LED dies 11.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A light-emitting diode (LED) light source comprising:
a plurality of LED dies; and
a plurality of electricity-conducting holding elements being metal sheets respectively;
wherein adjacent two of the electricity-conducting holding elements are configured to jointly hold and electrically connect to one of the LED dies to form a flexible LED light bar.

2. The LED light source as claimed in claim 1, wherein the electricity-conducting holding elements and the LED dies are alternately connected in series to form the flexible LED light bar.

3. The LED light source as claimed in claim 1, wherein each electricity-conducting holding element is a copper foil sheet, an aluminum foil sheet, a silver foil sheet, or a gold foil sheet.

4. The LED light source as claimed in claim 1, further comprising a transparent packaging body made of transparent resin material, transparent silicone material, or transparent polymer material; wherein the LED dies and the electricity-conducting holding elements are sealed in the transparent packaging body.

5. The LED light source as claimed in claim 1, wherein a length of each electricity-conducting holding element is greater than or equal to a length of each LED die, and a width of each electricity-conducting holding element is greater than or equal to one-half of a width of each LED die.

6. The LED light source as claimed in claim 1, wherein the LED light source is bent into a helical structure.

7. The LED light source as claimed in claim 1, wherein each LED die is a flip-chip LED die or an OLED die.

8. A light-emitting diode (LED) lamp comprising:
an LED light source comprising:
a plurality of LED dies; and
a plurality of electricity-conducting holding elements being metal sheets respectively; wherein adjacent two of the electricity-conducting holding elements are configured to jointly hold and electrically connect to one of the LED dies to form a flexible LED light bar;
a lamp base having a first connection part and a second connection part electrically connected to two opposite polarities of an external power source, respectively;
an insulated holder fixed on the lamp base;
a supporting element having a longitudinal part and a transverse part mounted on a top of the longitudinal part; wherein the longitudinal part is mounted on the insulated holder, and the LED light source helically surrounds an outside of the transverse part;

a plurality of fastening elements configured to fasten the LED light source on the transverse part; and a lamp cover configured to cover the lamp base and provide a containing space for containing the LED light source, the insulated holder, the supporting element, and the fastening elements.

9. The LED lamp as claimed in claim 8, wherein the electricity-conducting holding elements and the LED dies are alternately connected in series to form the LED light bar.

10. The LED lamp as claimed in claim 8, wherein each electricity-conducting holding element is a copper foil sheet, an aluminum foil sheet, a silver foil sheet, or a gold foil sheet.

11. The LED lamp as claimed in claim 8, wherein the LED light source further comprises a transparent packaging body made of transparent resin material, transparent silicone material, or transparent polymer material; wherein the LED dies and the electricity-conducting holding elements are sealed in the transparent packaging body.

12. The LED lamp as claimed in claim 8, wherein a length of each electricity-conducting holding element is greater than or equal to a length of each LED die, and a width of each electricity-conducting holding element is greater than or equal to one-half of a width of each LED die.

13. The LED lamp as claimed in claim 8, wherein the LED light source is bent into a helical structure.

14. The LED lamp as claimed in claim 8, wherein each LED die is a flip-chip LED die or an OLED die.

15. The LED lamp as claimed in claim 8, wherein the supporting element is a T-shaped element, and the transverse part is a horizontal part of the T-shaped element and the longitudinal part is an upright part of the T-shaped element.

16. The LED lamp as claimed in claim 9, wherein the supporting element is a T-shaped element, and the transverse part is a horizontal part of the T-shaped element and the longitudinal part is an upright part of the T-shaped element.

17. The LED lamp as claimed in claim 10, wherein the supporting element is a T-shaped element, and the transverse part is a horizontal part of the T-shaped element and the longitudinal part is an upright part of the T-shaped element.

18. The LED lamp as claimed in claim 11, wherein the supporting element is a T-shaped element, and the transverse part is a horizontal part of the T-shaped element and the longitudinal part is an upright part of the T-shaped element.

19. The LED lamp as claimed in claim 12, wherein the supporting element is a T-shaped element, and the transverse part is a horizontal part of the T-shaped element and the longitudinal part is an upright part of the T-shaped element.

20. The LED lamp as claimed in claim 13, wherein the supporting element is a T-shaped element, and the transverse part is a horizontal part of the T-shaped element and the longitudinal part is an upright part of the T-shaped element.

* * * * *